(12) United States Patent  (10) Patent No.: US 6,259,586 B1
Gill  (45) Date of Patent: Jul. 10, 2001

(54) MAGNETIC TUNNEL JUNCTION SENSOR WITH AP-COUPLED FREE LAYER

(75) Inventor: Hardayal (Harry) Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/389,188

(22) Filed: Sep. 2, 1999

(51) Int. Cl.[7] ............................ G11B 5/39; G11C 11/15
(52) U.S. Cl. ..................... 360/324.2; 360/314; 365/173
(58) Field of Search .................... 360/317, 324.2, 360/324.1, 314; 365/171, 173, 207, 158

(56) References Cited

U.S. PATENT DOCUMENTS

| | | | |
|---|---|---|---|
| 5,206,590 | 4/1993 | Dieny et al. | 324/252 |
| 5,650,958 | 7/1997 | Gallagher et al. | 365/173 |
| 5,720,410 | 2/1998 | Umiker | 20/4.26 |
| 5,966,012 | * 10/1999 | Parkin | 324/252 |
| 6,052,263 | * 4/2000 | Gill | 360/113 |
| 6,097,579 | * 8/2000 | Gill | 360/324.2 |
| 6,114,719 | * 9/2000 | Dill et al. | |

FOREIGN PATENT DOCUMENTS 11-163436 * 6/1999 (JP).

* cited by examiner

Primary Examiner—William Klimowicz
(74) Attorney, Agent, or Firm—William D. Gill

(57) ABSTRACT

A differential magnetic tunnel junction (MTJ) sensor is provided having a first MTJ stack, a second MTJ stack and a common AP-coupled free layer. The AP-coupled free layer comprises a ferromagnetic first sense layer and a ferromagnetic second sense layer with an antiferromagnetic coupling (APC) layer disposed between the two sense layers providing strong antiferromagnetic coupling. The thickness of the first sense layer is chosen to be different (greater or smaller) than the thickness of the second sense layer so that the AP-coupled free layer has a net magnetic moment oriented parallel to the ABS and free to rotate in the presence of a signal magnetic field. Antiferromagnetic (AFM) layers in the first and second MTJ stacks are set to pin the magnetizations of pinned layers in each stack perpendicular to the ABS and in the same direction with respect to one another. Having both AFM layers set in the same direction allows both AFM layers to be formed of the same antiferromagnetic material and both AFM layers may be set in the same process step during fabrication.

45 Claims, 8 Drawing Sheets

MAGNETIC TUNNEL JUNCTION SENSOR WITH AP-COUPLED FREE LAYER

BACKGROUND OF THE INVENTION

1. Field of the Invention

This invention relates in general to magnetic tunnel junction transducers for reading information signals from a magnetic medium and, in particular, to a differential magnetic tunnel junction sensor with an anti-parallel coupled free layer, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a nonmagnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier layer 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current Is from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Differential GMR sensors comprising dual SV sensor elements sharing a common electrode and electrically connected to a differential amplifier so that the responses of the two SV sensor elements to a signal field are additive provide advantages of increased sensitivity and common mode signal cancellation. Differential MTJ sensors having dual MTJ sensor elements can provide the same advantages. A differential MTJ sensor may be fabricated by depositing a first MTJ sensor comprising sequentially an AFM layer, a pinned ferromagnetic layer, a spacer layer, and a free ferromagnetic layer on a first electrode. A conductive common electrode is then deposited in contact with the free ferromagnetic layer of the first SV sensor. A second SV sensor comprising sequentially a ferromagnetic free layer, a spacer layer, a pinned ferromagnetic layer, and an AFM layer is then deposited on the common electrode. A second electrode deposited on the AFM layer of the second MTJ sensor completes the back-to-back configuration of the dual MTJ sensor elements making up the differential MTJ sensor. The first and second electrodes are connected to first and second inputs of a differential amplifier and the common electrode is connected to a common connector of the differential amplifier. A problem with this back-to-back configuration of the dual MTJ sensor elements is that the magnetization of the pinned ferromagnetic layers of the two MTJ sensor elements must be oppositely oriented with respect to each other in order to obtain an additive response to a signal field. Opposite orientation of the pinned layers may be achieved by using different materials for the AFM layers of the two MTJ sensors so that one AFM layer has a higher blocking temperature than the other allowing the magnetization of one AFM layer to be set at a high temperature and the magnetization of the other AFM layer to be set in an opposite direction at a lower temperature.

Disadvantages of using different AFM materials are the need for an additional target for deposition of the second AFM material and the added complexity of the manufacturing process for setting the magnetizations at different temperatures.

Therefore, there is a need for a differential MTJ sensor that provides the advantages of higher sensitivity and common mode rejection of a dual MTJ sensor using differential circuitry without the fabrication problems associated with the need to use antiferromagnetic layers of different materials having different blocking temperatures in order to properly set the pinned layer magnetizations of each MTJ sensor.

SUMMARY OF THE INVENTION

It is an object of the present invention to disclose a differential magnetic tunnel junction (MTJ) sensor having an antiparallel (AP) coupled free layer.

It is another object of the present invention to disclose a differential MTJ sensor having first and second antiferromagnetic (AFM) layers having their magnetizations pinned in the same direction.

It is yet another object of the present invention to disclose a differential MTJ sensor having first and second AFM layers formed of the same antiferromagnetic material.

It is a further object of the present invention to disclose a method for making a differential MTJ sensor having an AP-coupled free layer.

In accordance with the principles of the present invention, there is disclosed a differential MTJ sensor comprising a first MTJ stack separated from a second MTJ stack by an antiparallel coupling (APC) layer disposed between a ferromagnetic sense layer of the first MTJ stack and a ferromagnetic sense layer of the second MTJ stack. The APC layer is formed of a nonmagnetic, electrically conducting material that allows the sense layer of the first MTJ stack and the sense layer of the second MTJ stack to be strongly coupled together antiferromagnetically. The APC layer disposed between the first MTJ stack and the second MTJ stack is electrically connected to a common electrode for the differential MTJ sensor. Electrodes for providing sense current to the first MTJ stack and to the second MTJ stack are provided by a first shield and a second shield, respectively.

The first MTJ stack has a first sense layer separated from a first pinned layer by a tunnel barrier layer. A first antiferromagnetic layer (AFM1) layer adjacent to the first pinned layer provides an exchange field to fix (pin) the magnetization of the first pinned layer perpendicular to the ABS. Similarly, the second MTJ stack has a second sense layer separated from a second pinned layer by a tunnel barrier layer. A second antiferromagnetic layer (AFM2) layer adjacent to the second pinned layer provides an exchange field to pin the magnetization of the second pinned layer perpendicular to the ABS.

The first sense layer of the first MTJ stack and the second sense layer of the second MTJ stack are strongly coupled antiferromagnetically by the influence of the APC layer disposed therebetween forming a common AP-coupled free layer for the first and second MTJ stacks. The thickness of the first sense layer of the first MTJ stack is chosen to be different (greater or smaller) than the thickness of the second sense layer of the second MTJ stack so that the AP-coupled free layer has a net magnetic moment. The net magnetic moment of the AP-coupled free layer is oriented parallel to the ABS and is in the same direction as the magnetic moment of the thicker of the first sense or second sense layers, and is free to rotate in the presence of a signal magnetic field.

The AFM1 and AFM2 layers have their magnetizations set in the same direction in order to pin the magnetizations of the first pinned and second pinned layers, respectively, perpendicular to the ABS and in the same direction with respect to one another. Since the magnetoresistive responses of the first and second MTJ stacks are functions of the relative orientations of the magnetic moment of the first pinned and second pinned layers, respectively, with respect to the net magnetic moment of the AP-coupled free layer, having the first pinned and second pinned layers pinned in the same direction results in an additive response to a signal field of the first and second MTJ stacks in the differential MTJ sensor.

An advantage of having the AFM1 and AFM2 layers set in the same direction is that the same antiferromagnetic material may be used to form both layers and both layers can be set in the same process step during fabrication.

The above as well as additional objects, features, and advantages of the present invention will become apparent in the following detailed description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
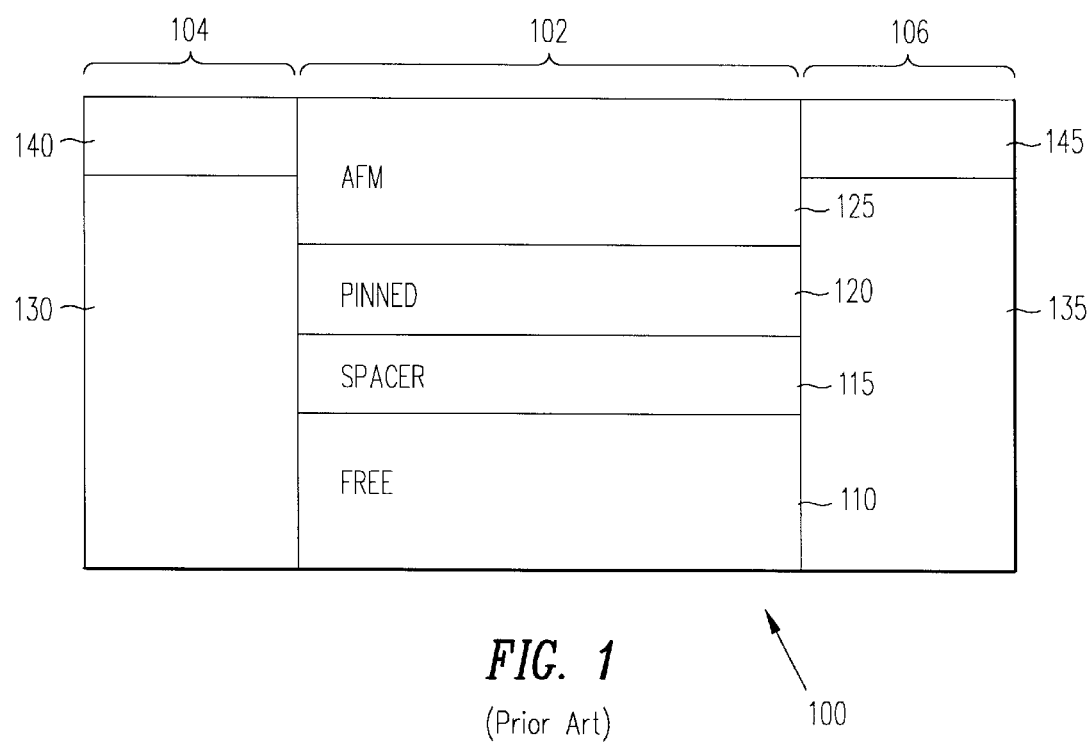
FIG. 1 is an air bearing surface view, not to scale, of a prior art SV sensor.
Figure 2:
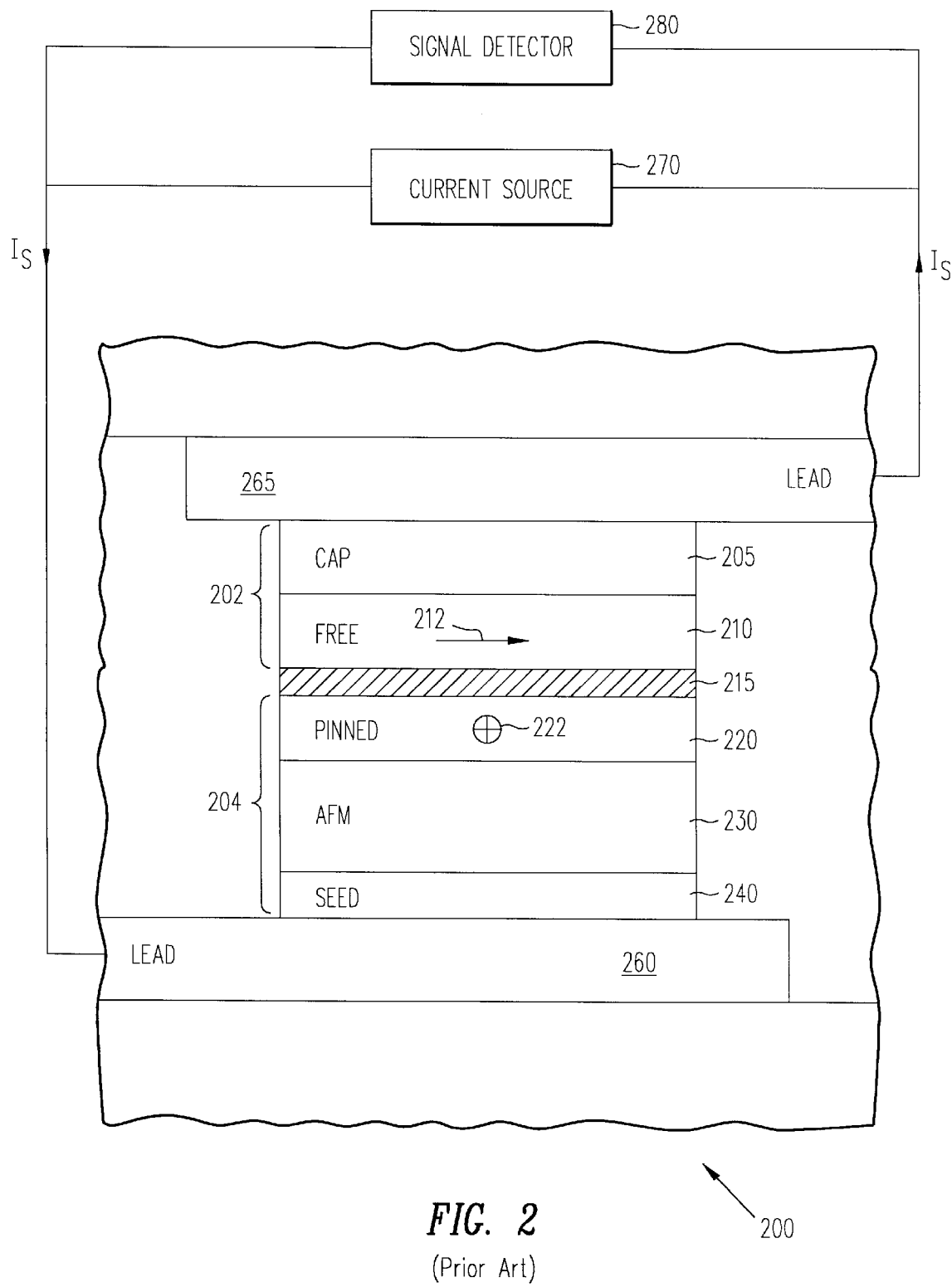
FIG. 2 is an air bearing surface view, not to scale, of a prior art MTJ sensor.
Figure 3:
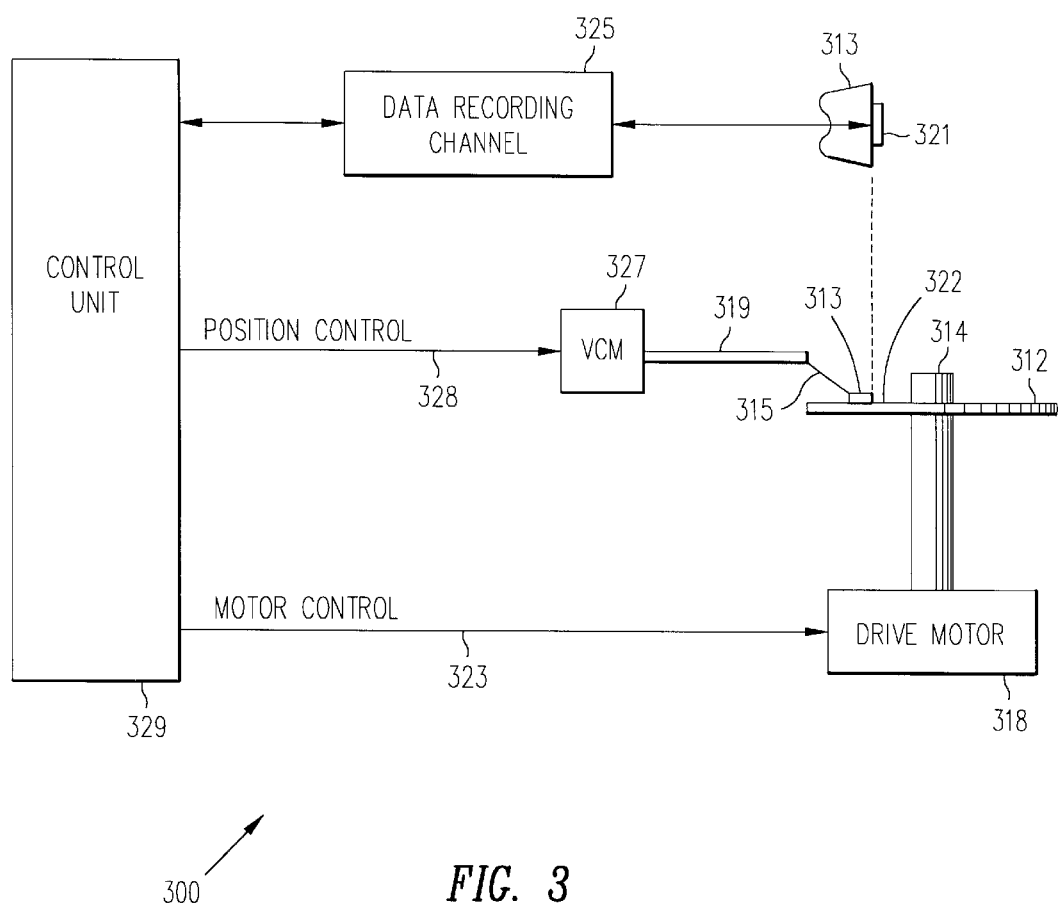
FIG. 3 is a simplified diagram of a magnetic recording disk drive system using the MTJ sensor of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the SV sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counterbalances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328.

The control signals on line 328 provide the desired current profiles to optimally move and position the slider 313 to the desired data track on the disk 312. Read and write signals are communicated to and from the read/write heads 321 by means of the recording channel 325. Recording channel 325 may be a partial response maximum likelihood (PMRL) channel or a peak detect channel. The design and implementation of both channels are well known in the art and to persons skilled in the art. In the preferred embodiment, recording channel 325 is a PMRL channel.

The above description of a typical magnetic disk storage system, and the accompanying illustration of FIG. 3 are for representation purposes only. It should be apparent that disk storage systems may contain a large number of disks and actuator arms, and each actuator arm may support a number of sliders.

Figure 4:
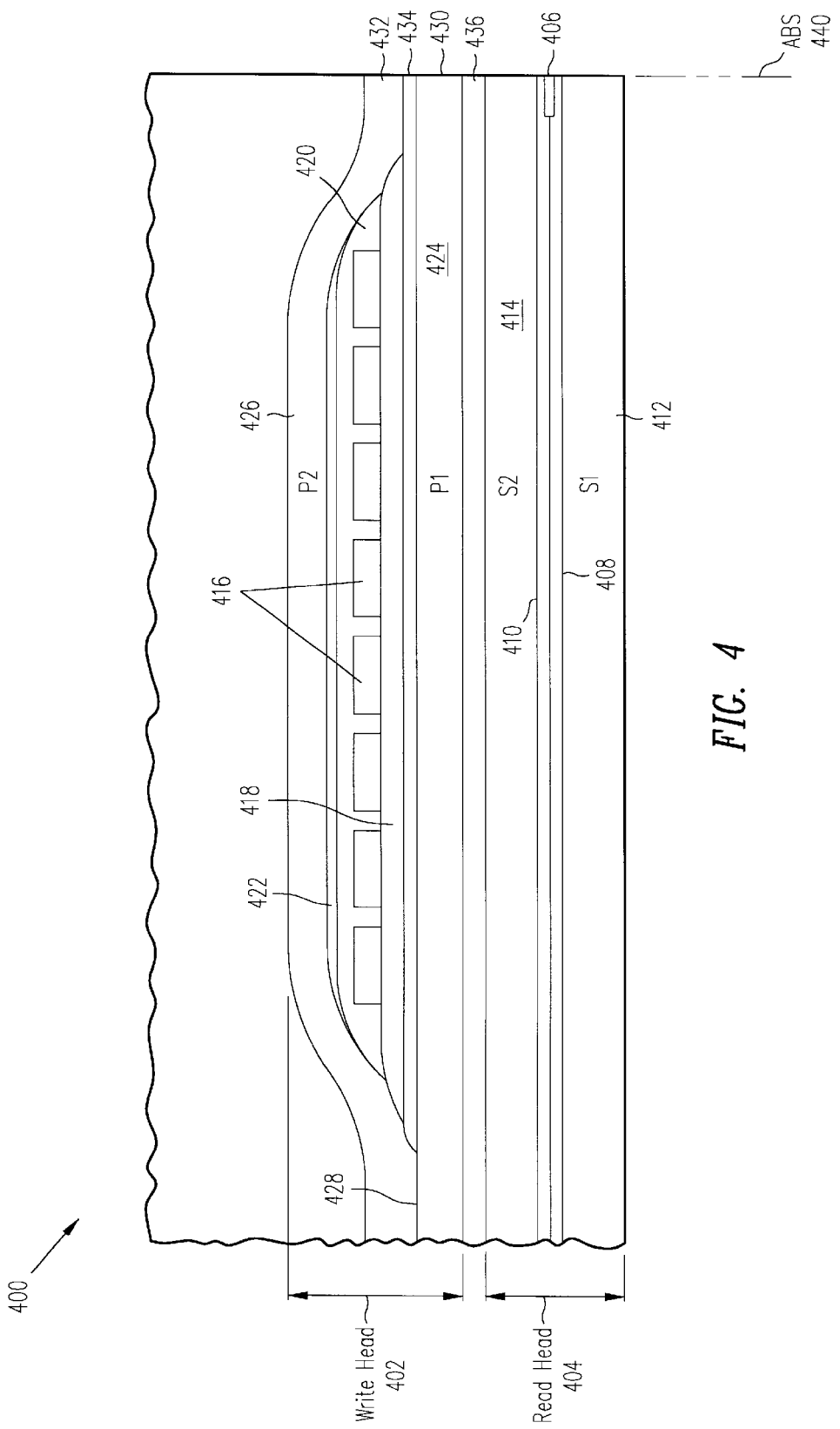
FIG. 4 is a vertical cross-section view, not to scale, of a "piggyback" read/write magnetic head.

FIG. 4 is a side cross-sectional elevation view of a "piggyback" magnetic read/write head 400, which includes a write head portion 402 and a read head portion 404, the read head portion employing a spin valve sensor 406 according to the present invention. The spin valve sensor 406 is sandwiched between nonmagnetic insulative first and second read gap layers 408 and 410, and the read gap layers are sandwiched between ferromagnetic first and second shield layers 412 and 414. In response to external magnetic fields, the resistance of the spin valve sensor 406 changes. A sense current Is conducted through the sensor causes these resistance changes to be manifested as potential changes. These potential changes are then processed as readback signals by the processing circuitry of the data recording channel 325 shown in FIG. 3.

The write head portion 402 of the magnetic read/write head 400 includes a coil layer 416 sandwiched between first and second insulation layers 418 and 420. A third insulation layer 422 may be employed for planarizing the head to eliminate ripples in the second insulation layer 420 caused by the coil layer 416. The first, second and third insulation layers are referred to in the art as an insulation stack. The coil layer 416 and the first, second and third insulation layers 418, 420 and 422 are sandwiched between first and second pole piece layers 424 and 426. The first and second pole piece layers 424 and 426 are magnetically coupled at a back gap 428 and have first and second pole tips 430 and 432 which are separated by a write gap layer 434 at the ABS 440. An insulation layer 436 is located between the second shield layer 414 and the first pole piece layer 424. Since the second shield layer 414 and the first pole piece layer 424 are separate layers this read/write head is known as a "piggyback" head.

Figure 5:
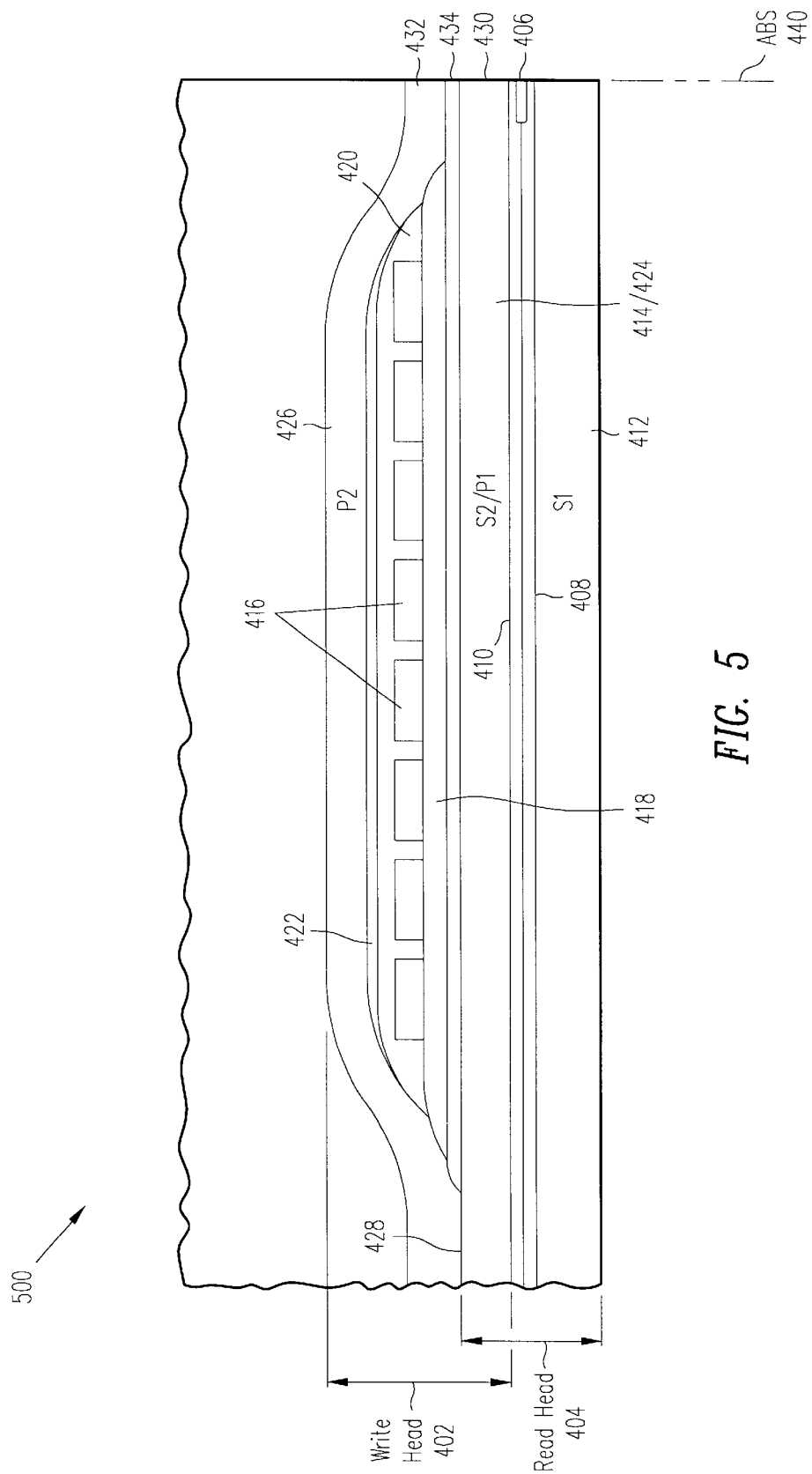
FIG. 5 is a vertical cross-section view, not to scale, of a "merged" read/write magnetic head.

FIG. 5 is the same as FIG. 4 except the second shield layer 414 and the first pole piece layer 424 are a common layer. This type of read/write head is known as a "merged" head 500. The insulation layer 436 of the piggyback head in FIG. 4 is omitted in the merged head 500 of FIG. 5.

Figure 6:
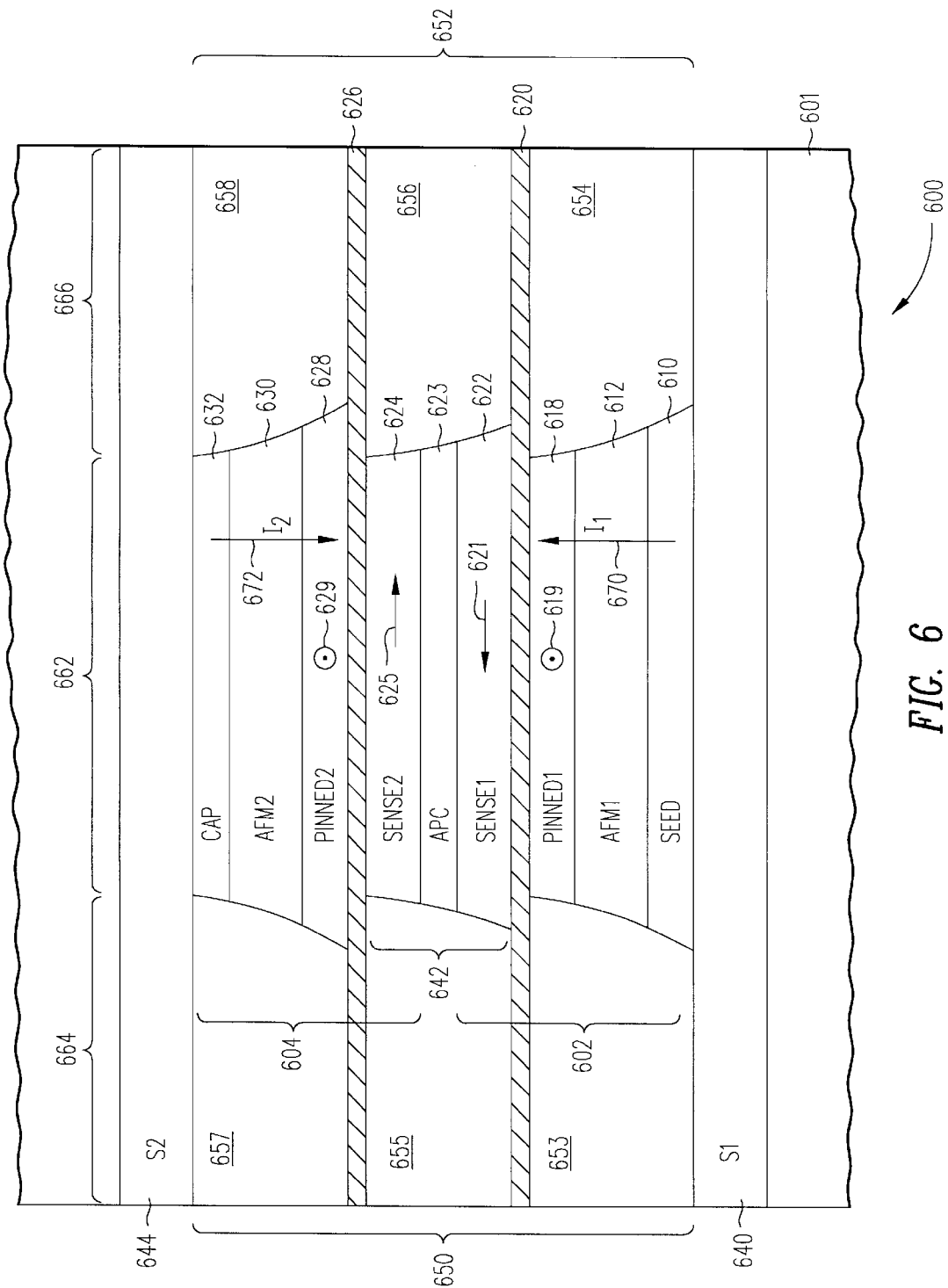
FIG. 6 is an air bearing surface view, not to scale, of an embodiment of the differential magnetic tunnel junction sensor of the present invention.

FIG. 6 shows an air bearing surface (ABS) view, not to scale, of an MTJ sensor 600 according to the preferred embodiment of the present invention. The MTJ sensor 600 comprises passive end regions 664 and 666 separated from each other by an active central region 662. The active region of the MTJ sensor 600 comprises a first MTJ stack 602 and a second MTJ stack 604 formed in the central region 662. The first MTJ stack 602 is formed directly on a first shield (S1) 640 in the central region 662. The first shield 640 is a layer of soft ferrmagnetic material such as Ni—Fe (permalloy, or alternatively Al—Fe—Si (Sendust), deposited on a substrate 601 and extending over the central region 662 and the end regions 664 and 666 to provide magnetic shielding of the MTJ sensor 600 from stray magnetic fields.

The first MTJ stack 602 comprises a ferromagnetic first sense (sense1) layer 622, a ferromagnetic first pinned (pinned1) layer 618, a first tunnel barrier layer 620 disposed between the sense1 layer 622 and the pinned1 layer 618, a seed layer 610 and a first antiferromagnetic (AFM1) layer 612 disposed between the pinned1 layer 618 and the seed layer 610. The AFM1 layer 612 is exchange coupled to the pinned1 layer 618 providing an exchange field to pin the magnetization direction 619 of the pinned1 layer 618 perpendicular to the ABS.

The second MTJ stack 604 comprises a ferromagnetic second sense (sense2) layer 624, a ferromagnetic second pinned (pinned2) layer 628, a second tunnel barrier layer 626 disposed between the sense2 layer 624 and the pinned2 layer 628, a cap layer 632 and a second antiferromagnetic layer (AFM2) 630 disposed between the pinned2 layer 628 and the cap layer 632. The AFM2 layer 630 is exchange coupled to the pinned2 layer 628 providing an exchange field to pin the magnetization direction 629 of the pinned2 layer 628 perpendicular to the ABS. The magnetization direction 629 of the pinned2 layer 628 is pinned parallel to and in the same direction as the magnetization direction 619 of the pinned1 layer 618 of the first MTJ stack 602.

An antiparallel coupling (APC) layer 623 is disposed between the sense1 layer 622 of the first MTJ stack 602 and the sense2layer 624 of the second MTJ stack 604. The APC layer 623 is formed of a nonmagnetic material, preferably ruthenium (Ru), that allows the sense1 layer 622 and the sense2 layer 624 to be strongly coupled together antiferromagnetically.

An antiparallel (AP)-coupled free layer 642 comprising the sense1 layer 622, the sense2 layer 624 and the APC layer 623 provides a common AP-coupled free layer 642 shared by the first MTJ stack 602 and the second MTJ stack 604 of the MTJ sensor 600. The magnetization 621 of the sense1 layer 622 and the magnetization 625 of the sense2 layer 624 are oriented parallel to the ABS and antiparallel with respect to each other. The net magnetization of the AP-coupled free layer 642, equal to the difference of the magnetizations 621 and 625 of the sense1 layer 622 and the sense2 layer 624, respectively, is oriented parallel to the ABS and is free to rotate in the presence of a magnetic field. The magnetizations of the sense1 layer 622 and the sense2layer 624 are chosen to differ by an equivalent magnetization of Ni—Fe having a thickness in the range of 10–20 Å so that the net magnetization of the AP-coupled free layer 642 will be in the range of 10–20 Å of Ni—Fe.

Insulator layers 650 and 652 of electrically insulating material such as $Al_2O_3$ are formed in the end regions 664 and 666, respectively, on the first shield 640 and in abutting contact with the first MTJ stack 602, the second MTJ stack 604 and the APC layer 623. A second shield (S2) 644 of soft ferromagnetic material such as Ni—Fe, or alternatively Al—Fe—Si, is formed over the insulator layers 650 and 652 in the end regions 664 and 666, respectively, and over the second MTJ stack 604 in the central region 662.

If longitudinal stabilization of the magnetic domain states of the sense layers 622 and 624 of the first and second MTJ stacks 602 and 604, respectively, is desired, hard bias layers may be provided in the end regions 664 and 666 as is known in the art. IBM's U.S. Pat. No. 5,720,410 granted to Fontana et al., and incorporated herein by reference, describes such a longitudinal biasing method for an MTJ sensor.

Figure 7:
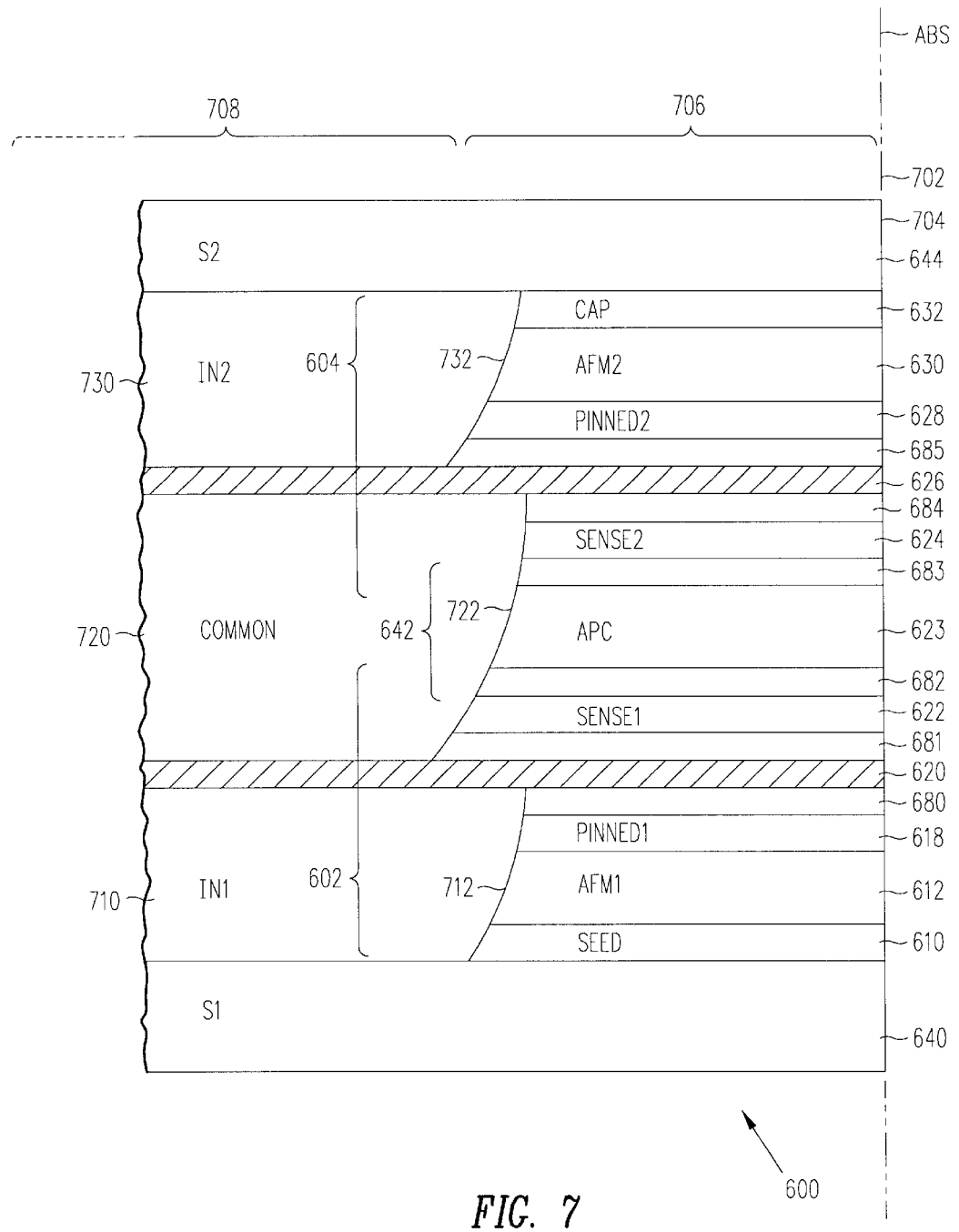
FIG. 7 is a vertical cross-section view, not to scale, of an embodiment of the differential magnetic tunnel junction sensor of the present invention.

FIG. 7 shows a vertical cross-section view, not to scale, of the MTJ sensor 600. The MTJ sensor 600 has a front region 706 and a back region 708. The active region of MTJ sensor 600 is formed in the front region 706 and has a front edge 704 at the ABS 702 and back edges 712, 732 and 722 of the first MTJ stack 602, the second MTJ stack 604 and the AP-pinned layer 642, respectively. A common electrode 720 is formed in the back region 708 to provide electrical contact to the AP-coupled free layer 642 at the back edge 722.

The MTJ sensor 600 may be fabricated in a magnetron sputtering or an ion beam sputtering system to sequentially deposit the multilayer structure shown in FIGS. 6 and 7. The first shield (S1) 640 of Ni—Fe having a thickness in the range of 5000–10000 Å is deposited on the substrate 601. The seed layer 610, the AFM1 layer 612, and the pinned1 layer 618 are sequentially deposited over the first shield 640 in the presence of a longitudinal or transverse magnetic field of about 40 Oe to orient the easy axes of all the ferromagnetic layers. The seed layer 610 is a layer deposited to modify the crystallographic texture or grain size of the subsequent layers, and may not be needed depending on the material of the subsequent layer. In the preferred embodiment, the seed layer 610 is formed of Ni—Mn—O, or alternatively of Ta, having a thickness of 30 Å deposited on the first shield 640 and a Co—Fe layer having a thickness of 10 Å deposited on the Ni—Mn—O layer. The AFM1 layer 612 formed of Ir—Mn, or alternatively Pt—Mn, Pt—Pd—Mn, or Ni—Mn, having a thickness of about 60 Å is deposited on the seed layer 610. The ferromagnetic pinned1 layer 618 may be formed of Ni—Fe having a thickness in the range of 20–50 Å, or alternatively, may be formed of a sub-layer of Ni—Fe having a thickness in the range of 20–50 Å deposited on the AFM1 layer 612 and an interface layer of cobalt (Co) having a thickness of about 5 Å deposited on the Ni—Fe sub-layer.

The bottom layers of the first MTJ stack are defined in the central region 662 of FIG. 6 and in the front region 706 of FIG. 7 by depositing a photoresist and using photolithography and ion milling processes well known in the art. The ion milling process defines the back edge 712 of the first MTJ stack 602. The insulator layer (IN1) 710, and the bottom portions 653 and 654 of insulator layers 650 and 652 can now be deposited on the first shield 640 in the back region 708 and in the end regions 664 and 666, respectively. The insulator layers 710, 653 and 654 are formed of $Al_2O_3$ having a thickness approximately equal to the total thickness of the seed layer 610, the AFM1 layer 612 and the pinned1 layer 618. The photoresist protecting the bottom layers of the first MTJ stack 602 is then removed and the first tunnel barrier layer 620 is formed of $Al_2O_3$ by depositing and then plasma oxidizing an 8–20 Å aluminum (Al) layer on the pinned1layer 618 and on the insulator layers (IN1) 710, 653 and 654 in the back region 708 and the edge regions 664 and 666.

The ferromagnetic sense1 layer 622, APC layer 623, and ferromagnetic sense2 layer 624 together forming the AP-coupled free layer are sequentially deposited over the first tunnel barrier layer 620 in the presence of a longitudinal or transverse magnetic field of about 40 Oe to orient the easy axes of the ferromagnetic layers. The sense1 layer 622 is preferably formed of a laminated multilayer comprising a ferromagnetic first interface layer formed of cobalt (Co) having a thickness of about 5 Å deposited on the first tunnel barrier layer 620, a ferromagnetic layer formed of Ni—Fe having a thickness in the range of 20–30 Å deposited on the first interface layer, and a ferromagnetic second interface layer formed of Co having a thickness of about 5 Å deposited on the ferromagnetic Ni—Fe layer. Alternatively, the sense1 layer may be formed of a single layer of Ni—Fe having a thickness in the range of 20–40 Å. The APC layer 623 is formed of ruthenium (Ru) having a thickness of about 6 Å deposited on the sense1 layer 622. The sense2 layer 624 is preferably formed of a laminated multilayer comprising a ferromagnetic first interface layer formed of cobalt (Co) having a thickness of about 5 Å deposited on the APC layer 623, a ferromagnetic layer formed of Ni—Fe having a thickness in the range of 20–30 Å deposited on the first interface layer, and a ferromagnetic second interface layer formed of Co having a thickness of about 5 Å deposited on the ferromagnetic Ni—Fe layer. Alternatively, the sense2 layer may be formed of a single layer of Ni—Fe having a thickness in the range of 20–40 Å.

The AP-coupled free layer 642 is defined in the central region 662 of FIG. 6 and in the front region 706 of FIG. 7 by depositing a photoresist and using photolithography and ion milling processes well known in the art. The ion milling process defines the back edge 722 of the AP-coupled free layer 642. The common electrode 720 can now be deposited on the first tunnel barrier layer 620 in the edge regions 664 and 666 and in the back region 708 to form a conducting lead electrically connected to the AP-coupled free layer 642 at the back edge 722. The common electrode 720 is formed of a nonmagnetic conducting metal such as gold (Au) having a thickness approximately equal to the total thickness of the AP-coupled free layer 642. Another photoresist and photolithography step is used to protect the common electrode 720 in the back region 708 and ion milling is used to remove the common electrode material from the edge regions 664 and 666. An insulator layer formed of $Al_2O_3$ having a thickness approximately equal to the total thickness of the AP-coupled free layer is deposited on the first tunnel barrier layer 620 in the edge regions 664 and 666 to provide the middle portions 655 and 656 of the insulator layers 650 and 652, respectively.

The photoresist protecting the AP-coupled free layer 642 and the photoresist protecting the common electrode 720 are removed and the second tunnel barrier layer 626 is formed of $Al_2O_3$ by depositing and then plasma oxidizing an 8–20 Å aluminum (Al) layer on the sense2 layer 624, on the common electrode 720 in the back region 708, and on the middle portions 655 and 656 of the insulator layers 650 and 652 in the edge regions 664 and 666. The ferromagnetic pinned2 layer 628 may be formed of Ni—Fe having a thickness in the range of 20–50 Å, or alternatively, may be formed of an interface layer of cobalt (Co) having a thickness of about 5 Å deposited on the second tunnel barrier layer 626 and a sub-layer of Ni—Fe having a thickness in the range of 20–50 Å deposited on the Co interface layer. The AFM2 layer 630 formed of Ir—Mn, or alternatively Pt—Mn, Pt—Pd—Mn, or Ni—Mn, having a thickness of about 60 Å is deposited on the pinned2 layer 628. The cap layer 632 formed of tantalum (Ta) having a thickness of about 50 Å is deposited on the AFM2 layer 630.

The top layers of the second MTJ stack are defined in the central region 662 and in the front region 706 by depositing a photoresist and using photolithography and ion milling processes well known in the art. The ion milling process defines the back edge 732 of the second MTJ stack 604. The insulator layer (IN2) 730 and the top portions 657 and 658 of insulator layers 650 and 652 can now be deposited on the second tunnel barrier layer 626 in the back region 708 and in the end regions 664 and 666, respectively. The insulator layers 730, 657 and 658 are formed of $Al_2O_3$ having a thickness approximately equal to the total thickness of the pinned2 layer 628, the AFM21 layer 630 and the cap layer 632. The photoresist protecting the top layers of the second MTJ stack 604 is removed and the second shield 644 (S2) 644 of Ni—Fe having a thickness in the range of 5000–10000 Å is deposited on the the front and rear portions 706 and 708 of the MTJ sensor 600.

Referring again to FIGS. 6 and 7, the first shield (S1) 640 and the common electrode 720 provide electrical connections for the flow of sensing current $I_1$ to the first MTJ stack 602. In the first MTJ stack 602, the flow of the sensing current $I_1$ is in a direction perpendicular to the plane of the first tunnel barrier layer 620 as shown by arrow 670. The second shield (S2) 644 and the common electrode 720 provide electrical connections for the flow of sensing current $I_2$ to the second MTJ stack 604. In the second MTJ stack 604, the flow of the sensing current $I_2$ is in a direction perpendicular to the plane of the second tunnel barrier layer 626 as shown by the arrow 672. Insulator layers 650 and 652 provide electrical insulation in the end regions 664 and 666, respectively, preventing shunting of the sensing currents $I_1$ and $I_2$ around the first and second MTJ stacks 602 and 604.

After the fabrication process of MTJ sensor 600 has been completed, the magnetizations of the pinned layers 618 and 628 of the first MTJ stack 602 and the second MTJ stack 604, respectively, must be fixed in a parallel orientation by an initialization process. With the magnetizations of pinned layers 618 and 628 fixed perpendicular to the ABS and parallel with respect to each other as shown by arrows 619 and 629 (heads of arrows pointing out of the plane of the paper), respectively, the magnetoresistive signals generated due to an external field from the disk acting on the net magnetic moment of the AP-coupled free layer 642 will differ in phase by 180° for the signal from the first MTJ stack 602 relative to the signal from the second MTJ stack 604. The phase difference is due to the antiparallel orientation of the magnetizations 621 and 625 of the sense1 and sense2 layers 622 and 624, respectively, and to the strong antiferromagnetic coupling of the two layers which maintains their antiparallel orientation in the presence of an external magnetic field.

Since the AFM1 and AFM2 layers 612 and 630 are to be oriented in the same direction, a single process may be used to orient both antiferromagnetic layers and both layers may be formed of the same material having the same blocking temperature (the blocking temperature is the temperature at which the exchange coupling becomes zero). The AFM1 and AFM2 layers 612 and 630 are oriented by heating the MTJ sensor 600 above the blocking temperature of the antiferromagnetic material being used (the blocking temperature of Ir—Mn is approximately 250° C.) and then with an external magnetic field greater than about 5000 Oe applied perpendicular to the ABS, cooling the sensor. After setting the AFM1 and AFM2 layers 612 and 630 in the external magnetic field, the magnetizations 619 and 629 of of the pinned1 and pinned2 layers 618 and 628, respectively, are set parallel to each other and perpendicular to the ABS.

Figure 8:
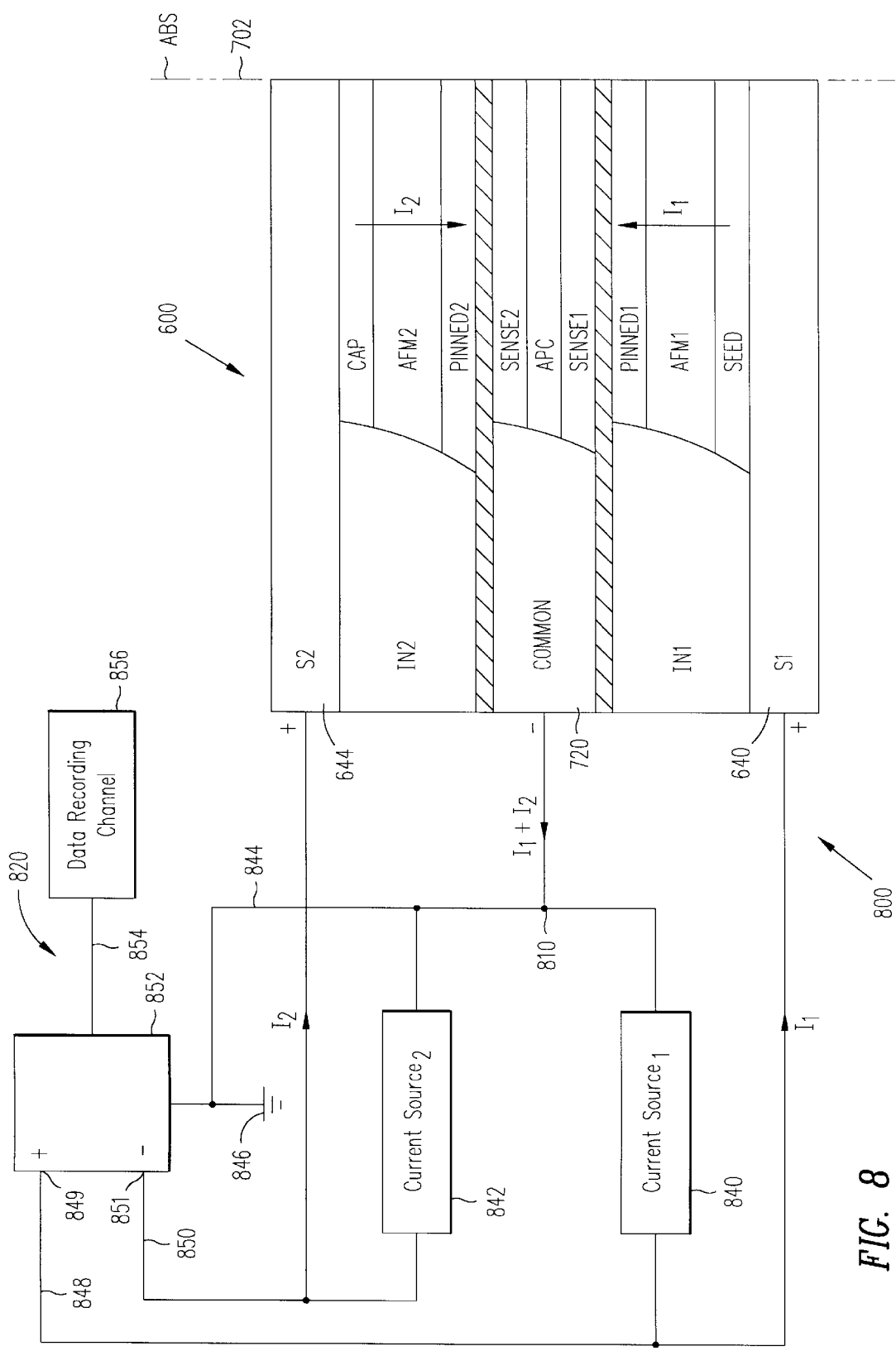
FIG. 8 is a schematic diagram illustrating a circuit employing the differential magnetic tunnel junction according to an embodiment of the present invention.

FIG. 8 is a schematic diagram illustrating a circuitry 800 employing the differential magnetic tunnel junction 600 according to the preferred embodiment of the present invention. Circuitry 800 comprises MTJ sensor 600 having first shield (S1) 640 and second shield (S2) 644 electrodes and a common electrode 720, a first current source 840, a second current source 842, and a differential circuit 852. The differential circuit 852 includes a first input terminal 849, a second input terminal 851, an output terminal 854, and a ground (reference) terminal 846.

Referring now to FIGS. 7 and 8, the first current source 840 is connected to the first shield (S1) 640 and to the common electrode 720 to provide the sense current $I_1$ to the first MTJ stack 602. The second current source 842 is connected to the second shield (S2) 644 and to the common electrode 720 to provide the sense current $I_2$ to the second MTJ stack 604. Currents $I_1$ and $I_2$ are adjusted so that with no external magnetic field (signal field) present, the product of the first MTJ stack resistance times $I_1$ (i.e, the voltage drop across the first MTJ stack) is equal to the product of the second MTJ sensor resistance times $I_2$ (the voltage drop across the second MTJ stack).

The first shield (S1) 640 is also connected, via the wire 848, to the first input terminal 849 of the differential circuit 852 and the second shield (S2) 644 is also connected, via the wire 850, to the second input terminal 851 of the differential circuit 852. The common electrode is preferably connected to a common wiring pad 810. The common pad 810 in turn is connected, via wire 844, to the ground 846 of the differential circuit 852. The output terminal 854 of the differential circuit 852 is then connected to the data recording channel 856 for further processing of the detected signals according to the description of FIG. 3. The recording channel 856 and the differential circuit 852 together are referred to as the recording system 820. Differential circuit 852 is preferentially a silicon-based high-speed differential amplifier integrated into the same silicon chip that the data recording channel 856 is integrated into. Differential circuit 852 further has a differential gain such that the output voltage at node 854 due to the difference between the voltages applied to its first and second input terminals 849 and 851 can be expressed in terms of:

$$V_{854}=A*(V_{849}-V_{851})$$

where A is the differential gain of the differential circuit 852. The design of a differential amplifier is known to one of ordinary skill in the art.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A magnetic tunnel junction (MTJ) sensor, comprising:
    a first MTJ stack, comprising:
        a first antiferromagnetic (AFM1) layer;
        a first tunnel barrier layer; and
        a first ferromagnetic pinned layer disposed between the AFM1 layer and the first tunnel barrier layer;
    a second MTJ stack, comprising:
        a second antiferromagnetic (AFM2) layer;
        a second tunnel barrier layer; and
        a second ferromagnetic pinned layer disposed between the AFM2 layer and the second tunnel barrier layer; and
    an antiparallel (AP)-coupled free layer disposed between the first tunnel barrier layer and the second tunnel barrier layer, said AP-coupled free layer comprising a ferromagnetic first sense layer adjacent to and in contact with the first tunnel barrier layer, a ferromagnetic second sense layer adjacent to and in contact with the second tunnel barrier layer and an antiparallel coupling (APC) layer disposed between the first sense layer and the second sense layer.

2. The MTJ sensor as recited in claim 1 wherein the first sense layer comprises:

a ferromagnetic first interface layer made of cobalt formed on the first tunnel barrier layer;
a ferromagnetic second interface layer made of cobalt; and
a ferromagnetic layer made of Ni—Fe disposed between the first interface layer and the second interface layer.

3. The MTJ sensor as recited in claim 2 wherein the first interface layer has a thickness of about 5 Å.

4. The MTJ sensor as recited in claim 2 wherein the second interface layer has a thickness of about 5 Å.

5. The MTJ sensor as recited in claim 2 wherein said ferromagnetic layer made of Ni—Fe has a thickness in the range of 20–30 Å.

6. The MTJ sensor as recited in claim 1 wherein the second sense layer comprises:

a ferromagnetic first interface layer made of cobalt formed on the APC layer;
a ferromagnetic second interface layer made of cobalt; and
a ferromagnetic layer made of Ni—Fe disposed between the first interface layer and the second interface layer.

7. The MTJ sensor as recited in claim 6 wherein the first interface layer has a thickness of about 5 Å.

8. The MTJ sensor as recited in claim 6 wherein the second interface layer has a thickness of about 5 Å.

9. The MTJ sensor as recited in claim 6 wherein said ferromagnetic layer made of Ni—Fe has a thickness in the range of 20–30 Å.

10. The MTJ sensor as recited in claim 1 wherein the APC layer is made of ruthenium.

11. The MTJ sensor as recited in claim 1 wherein the first sense layer is made of Ni—Fe.

12. The MTJ sensor as recited in claim 11 wherein the first sense layer has a thickness in the range of 20–40 Å.

13. The MTJ sensor as recited in claim 1 wherein the second sense layer is made of Ni—Fe.

14. The MTJ sensor as recited in claim 13 wherein the second sense layer has a thickness in the range of 20–40 Å.

15. The MTJ sensor as recited in claim 1 wherein the first and second tunnel barrier layers are made of $Al_2O_3$.

16. The MTJ sensor as recited in claim 1 wherein the AFM1 and AFM2 layers are made of Ir—Mn.

17. The MTJ sensor as recited in claim 1 wherein the AFM1 and AFM2 layers are selected from a group of materials consisting of Ir—Mn, Pt—Mn, Pt—Pd—Mn, and Ni—Mn.

18. The MTJ sensor as recited in claim 1 wherein the AFM1 and AFM2 layers each have a thickness of about 60 Å.

19. The MTJ sensor as recited in claim 1 wherein the first and the second ferromagnetic pinned layers are made of Ni—Fe.

20. The MTJ sensor as recited in claim 1 wherein the first and second ferromagnetic pinned layers comprise a sublayer of NiFe and an interface layer of Co in contact with the tunnel barrier layers.

21. The MTJ sensor as recited in claim 1 wherein the magnetization direction of the first pinned layer in the first MTJ stack is parallel to the magnetization direction of the second pinned layer in the second MTJ stack.

22. A magnetic tunnel junction (MTJ) sensor, comprising:
    a first MTJ stack, comprising:
        a first antiferromagnetic (AFM1) layer;
        a first tunnel barrier layer; and
        a first ferromagnetic pinned layer disposed between the AFM1 layer and the first tunnel barrier layer;

a second MTJ stack, comprising:
  a second antiferromagnetic (AFM2) layer;
  a second tunnel barrier layer; and
  a second ferromagnetic pinned layer disposed between the AFM2 layer and the second tunnel barrier layer; and
an antiparallel (AP)-coupled free layer disposed between the first tunnel barrier layer and the second tunnel barrier layer, said AP-coupled free layer comprising a ferromagnetic first sense layer adjacent to and in contact with the first tunnel barrier layer, a ferromagnetic second sense layer adjacent to and in contact with the second tunnel barrier layer, and an antiparallel coupling (APC) layer disposed between the first sense layer and the second sense layer; and said AP-coupled free layer having a back edge electrically connected to a common electrode in a back region of the MTJ sensor;
a first shield in contact with said first MTJ stack for providing a first sense current to said first MTJ stack; and
a second shield in contact with said second MTJ stack for providing a second sense current to said second MTJ stack.

23. The MTJ sensor as recited in claim 22 wherein the common electrode is made of gold.

24. The MTJ sensor as recited in claim 22 wherein the magnetization direction of the first pinned layer in the first MTJ stack is parallel to the magnetization direction of the second pinned layer in the second MTJ stack.

25. A magnetic read/write head, comprising:
a write head including:
  at least one coil layer and an insulation stack, the coil layer being embedded in the insulation stack;
  first and second pole piece layers connected at a back gap and having pole tips with edges forming a portion of an air bearing surface (ABS);
  the insulation stack being sandwiched between the first and second pole piece layers; and
  a write gap layer sandwiched between the pole tips of the first and second pole piece layers and forming a portion of the ABS;
a read head including:
  a magnetic tunnel junction (MTJ) sensor, first and second shield layers and a common electrode, the MTJ sensor being sandwiched between the first and second shield layers; the MTJ sensor including:
    a first MTJ stack, comprising:
      a first antiferromagnetic (AFM1) layer;
      a first tunnel barrier layer; and
      a first ferromagnetic pinned layer disposed between the AFM1 layer and the first tunnel barrier layer;
    a second MTJ stack, comprising:
      a second antiferromagnetic (AFM2) layer;
      a second tunnel barrier layer; and
      a second ferromagnetic pinned layer disposed between the AFM2 layer and the second tunnel barrier layer; and
    an antiparallel-coupled (AP) free layer disposed between the first tunnel barrier layer and the second tunnel barrier layer, said AP-coupled free layer comprising a ferromagnetic first sense layer adjacent to and in contact with the first tunnel barrier layer, a ferromagnetic second sense layer adjacent to and in contact with the second tunnel barrier layer, and an antiparallel coupling (APC) layer disposed between the first sense layer and the second sense layer; and
    a back edge of said AP-coupled free layer connected to the common electrode; and
  an insulation layer disposed between the second shield layer of the read head and the first pole piece layer of the write head.

26. The magnetic read/write head as recited in claim 25 wherein the first sense layer comprises:
  a ferromagnetic first interface layer made of cobalt formed on the first tunnel barrier layer;
  a ferromagnetic second interface layer made of cobalt; and
  a ferromagnetic layer made of Ni—Fe disposed between the first interface layer and the second interface layer.

27. The magnetic read/write head as recited in claim 26 wherein the first interface layer has a thickness of about 5 Å.

28. The magnetic read/write head as recited in claim 26 wherein the second interface layer has a thickness of about 5 Å.

29. The magnetic read/write head as recited in claim 26 wherein said ferromagnetic layer made of Ni—Fe has a thickness in the range of 20–30 Å.

30. The magnetic read/write head as recited in claim 25 wherein the second sense layer comprises:
  a ferromagnetic first interface layer made of cobalt formed on the APC layer;
  a ferromagnetic second interface layer made of cobalt; and
  a ferromagnetic layer made of Ni—Fe disposed between the first interface layer and the second interface layer.

31. The magnetic read/write head as recited in claim 30 wherein the first interface layer has a thickness of about 5 Å.

32. The magnetic read/write head as recited in claim 30 wherein the second interface layer has a thickness of about 5 Å.

33. The magnetic read/write head as recited in claim 30 wherein said ferromagnetic layer made of Ni—Fe has a thickness in the range of 20–30 Å.

34. The magnetic read/write head as recited in claim 25 wherein the APC layer is made of ruthenium.

35. The magnetic read/write head as recited in claim 25 wherein the first sense layer is made of Ni—Fe.

36. The magnetic read/write head as recited in claim 35 wherein the first sense layer has a thickness in the range of 20–40 Å.

37. The magnetic read/write head as recited in claim 25 wherein the second sense layer is made of Ni—Fe.

38. The magnetic read/write head as recited in claim 37 wherein the second sense layer has a thickness in the range of 20–40 Å.

39. The magnetic read/write head as recited in claim 25 wherein the first and second tunnel barrier layers are made of $Al_2O_3$.

40. The magnetic read/write head as recited in claim 25 wherein the AFM1 and AFM2 layers are made of Ir—Mn.

41. The magnetic read/write head as recited in claim 25 wherein the AFM1 and AFM2 layers are selected from a group of materials consisting of Ir—Mn, Pt—Mn, Pt—Pd—Mn and Ni—Mn.

42. The magnetic read/write head as recited in claim 25 wherein the AFM1 and AFM2 layers each have a thickness of about 60 Å.

43. The magnetic read/write head as recited in claim 25 wherein the first and the second ferromagnetic pinned layers are made of Ni—Fe.

44. The magnetic read/write head as recited in claim 25 wherein the first and second ferromagnetic pinned layers comprise a sublayer of Ni—Fe and an interface layer of Co in contact with the tunnel barrier layers.

45. A disk drive system comprising:

a magnetic recording disk;

a magnetic read/write head for magnetically recording data on the magnetic recording disk and for sensing magnetically recorded data on the magnetic recording disk, said magnetic read/write head comprising:

a write head including:

at least one coil layer and an insulation stack, the coil layer being embedded in the insulation stack;

first and second pole piece layers connected at a back gap and having pole tips with edges forming a portion of an air bearing surface (ABS);

the insulation stack being sandwiched between the first and second pole piece layers; and a write gap layer sandwiched between the pole tips of the first and second pole piece layers and forming a portion of the ABS;

a read head including:

a magnetic tunnel junction (MTJ) sensor, first and second shield layers and a common electrode, the MTJ sensor being sandwiched between the first and second shield layers; the MTJ sensor including:

a first MTJ stack, comprising:

a first antiferromagnetic (AFM1) layer;

a first tunnel barrier layer; and a first ferromagnetic pinned layer disposed between the AFM1 layer and the first tunnel barrier layer;

a second MTJ stack, comprising:

a second antiferromagnetic (AFM2) layer;

a second tunnel barrier layer; and a second ferromagnetic pinned layer disposed between the AFM2 layer and the second tunnel barrier layer; and an AP-coupled free layer disposed between the first tunnel barrier layer and the second tunnel barrier layer, said AP-coupled free layer comprising a ferromagnetic first sense layer adjacent to and in contact with the first tunnel barrier layer, a ferromagnetic second sense layer adjacent to and in contact with the second tunnel barrier layer, and an antiparallel coupling (APC) layer disposed between the first sense layer and the second sense layer; and a back edge of said AP-coupled free layer connected to the common electrode; and an insulation layer disposed between the second shield layer of the read head and the first pole piece layer of the write head;

an actuator for moving said magnetic read/write head across the magnetic disk so that the read/write head may access different regions of the magnetic recording disk; and a recording channel coupled electrically to the write head for magnetically recording data on the magnetic recording disk and to the MTJ sensor of the read head for detecting changes in resistance of the MTJ sensor caused by rotation of the magnetization axis of the AP-coupled free layer relative to the fixed magnetizations of the first and second pinned layers in response to magnetic fields from the magnetically recorded data.

* * * * *